United States Patent [19]
Nguyen et al.

[11] Patent Number: 6,069,051
[45] Date of Patent: May 30, 2000

[54] METHOD OF PRODUCING PLANAR METAL-TO-METAL CAPACITOR FOR USE IN INTEGRATED CIRCUITS

[75] Inventors: Du B. Nguyen, Fairfield County, Conn.; Hazara S. Rathore; George S. Prokop, both of Dutchess County, N.Y.; Richard A. Wachnik, Putnam County; Craig R. Gruszecki, Dutchess County, both of N.Y.

[73] Assignee: International Business Machines Corporation, Armonk, N.Y.

[21] Appl. No.: 08/668,017

[22] Filed: Jun. 17, 1996

[51] Int. Cl.⁷ .................................................. H01L 21/20
[52] U.S. Cl. .................. 438/396; 438/397; 438/301; 438/643; 438/945
[58] Field of Search ..................... 438/250, 210, 438/204, 253, 254, 329, 387, 396, 397, 643, 239, 945, 957, 301

[56] References Cited

U.S. PATENT DOCUMENTS

| | | | |
|---|---|---|---|
| 4,471,405 | 9/1984 | Howard et al. | 257/535 |
| 4,481,283 | 11/1984 | Kerr et al. | 257/532 |
| 4,959,705 | 9/1990 | Lemnios et al. | 257/532 |
| 4,997,789 | 3/1991 | Keller et al. | 438/945 |
| 5,091,047 | 2/1992 | Cleeves et al. | 438/945 |
| 5,108,951 | 4/1992 | Chen et al. | 438/643 |
| 5,208,726 | 5/1993 | Apel | 257/532 |
| 5,227,323 | 7/1993 | Nishitsuji et al. | 438/396 |
| 5,281,837 | 1/1994 | Kohyama | 257/296 |
| 5,416,042 | 5/1995 | Beach et al. | 438/396 |
| 5,461,536 | 10/1995 | Beach et al. | 257/528 |
| 5,466,629 | 11/1995 | Mihara et al. | 438/3 |
| 5,472,900 | 12/1995 | Vu et al. | 438/396 |
| 5,478,772 | 12/1995 | Fazan | 438/396 |
| 5,479,316 | 12/1995 | Smrtic et al. | 257/532 |
| 5,610,101 | 3/1997 | Koyama | 438/396 |
| 5,622,893 | 4/1997 | Summerfelt et al. | 438/396 |
| 5,708,559 | 1/1998 | Brabazon et al. | 257/301 |

*Primary Examiner*—Peter Toby Brown
*Assistant Examiner*—Khanh Duong
*Attorney, Agent, or Firm*—Whitham, Curtis & Whitham; H. Daniel Schnurmann

[57] ABSTRACT

A method of fabricating on chip metal-to-metal capacitors (MMCAP) uses planar processing with a flexible choice of dielectric, thickness and capacitor shape. The method provides a simpler process which has a better yield and more reliable structure by creating a metal-to-metal capacitor on a planar surface, not in deep trenches. In addition to the process simplicity, the method also allows the use of any dielectric materials which are needed by the product designer; e.g., higher or lower dielectric constant and also not limited by high etch rate difference. Because the inventive process is a planar process, there are no corners in the bottom of deep trenches to cause yield and reliability problems. The capacitor area can be adjusted to any shape because there are no edge effects.

17 Claims, 6 Drawing Sheets

METHOD OF PRODUCING PLANAR METAL-TO-METAL CAPACITOR FOR USE IN INTEGRATED CIRCUITS

BACKGROUND OF THE INVENTION

1. Field of the Invention

The present invention generally relates to the manufacture of electrical capacitors for use in integrated circuits and, more particularly, to a method of fabricating on chip metal to metal capacitors using planar processing techniques for applications such as on-chip decoupling capacitors.

2. Background Description

Presently, decoupling capacitors on an integrated circuit chip are fabricated by adding a thin dielectric layer between two metal layers as follows. First, with reference to FIG. 1, a lower metal (M1) 11 is deposited on an oxide layer 12 and patterned. After the M1 11 is deposited and patterned, a thick interlevel dielectric (ILD) 13 is applied. The ILD is then etched for both contact vias 14 and for the region 15 where the capacitor is to be formed. A blanket thin dielectric (TD) 16 is then deposited. Conventional photolithographic techniques are used to remove the TD from the contact via holes. In the structure shown, a tungsten stud 17 is formed in the region 15 where the capacitor is to be formed. Finally, the upper level metal (M2) is applied and patterned to form the top plate of the capacitor 18, the contact 19 to the lower plate and any other contacts to the circuits.

The primary drawback of such a capacitor structure is the trade off in thickness of the TD layer 16. Thinner layers are desirable for maximum capacitance, but thicker layers are required for yield and reliability considerations. The current process is not a robust reliable process because (a) it requires conformal deposition of a thin dielectric film into narrow gaps at high aspect ratios, (b) it is difficult to control residues and surface texture on top of the lower metal plate and on the sidewalls of the trough, and (c) the process must be integrated with the stud deposition process and its associated cleans.

SUMMARY OF THE INVENTION

It is therefore an object of the present invention to provide a method of fabricating metal-to-metal capacitors (MMCAP) using planar processing with a flexible choice of dielectric, thickness and capacitor shape.

According to the invention, a new method of forming metal-to-metal capacitors provides a simpler process which has a better yield and more reliable structure by creating a metal-to-metal capacitor on a planar surface, not in deep trenches. In addition to the process simplicity, the new method also allows the use of any dielectric materials which are needed by the product designer; e.g., higher or lower dielectric constant and also not limited by high etch rate difference. Because the inventive process is a planar process, there are no corners in the bottom of deep trenches to cause yield and reliability problems. The capacitor area can be adjusted to any shape because there are no edge effects.

In the practice of a preferred embodiment of the invention, an on chip planar metal-to-metal capacitor formed as follows. A first metal layer is deposited and patterned. A blanket layer of interlevel dielectric is then deposited over the patterned first metal layer. This interlevel dielectric is planarized, and then a stud is formed in the interlevel dielectric which contacts said first metal layer and is nearly planar with the interlevel dielectric surface. A blanket layer of metallic conductor is next deposited to form the bottom layer of the capacitor. Preferably, the this metallic conductor is SiCr but may be any metallic conductor such as, for example, Al. A blanket layer of capacitor dielectric, such as $SiO_2$, is deposited over the metallic conductor. A blanket layer of refractory metal is then deposited over the capacitor dielectric. The refractory metal may be W or Mo. The refractory metal is masked and etched to form a top plate of the capacitor. Using the patterned refractory metal layer, the dielectric layer and the metallic conductor layer are patterned and etched to form the capacitor dielectric and the bottom plate of the capacitor, respectively. A thin blanket layer of dielectric, such as $SiO_2$, is then deposited. The thin dielectric layer formed is anisotropically etched to remove the dielectric from the top plate of the capacitor while leaving a protective dielectric sidewall defining edges of the capacitor. Finally, a wiring level contacting the top plate of the capacitor is formed. This wiring level may be formed in direct contact with the capacitor top plate, or a damascene process may be used to form the wires.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
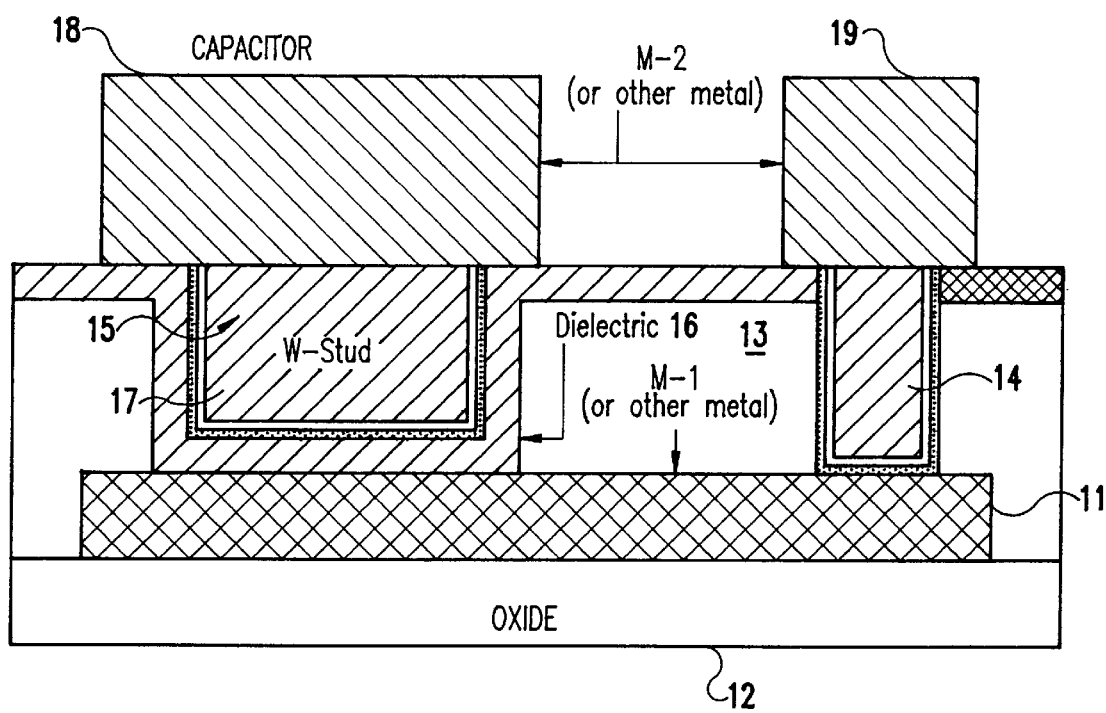
FIG. 1 is a cross-sectional view of an on chip metal-to-metal capacitor manufactured using conventional ,fabrication techniques.
Figure 2:
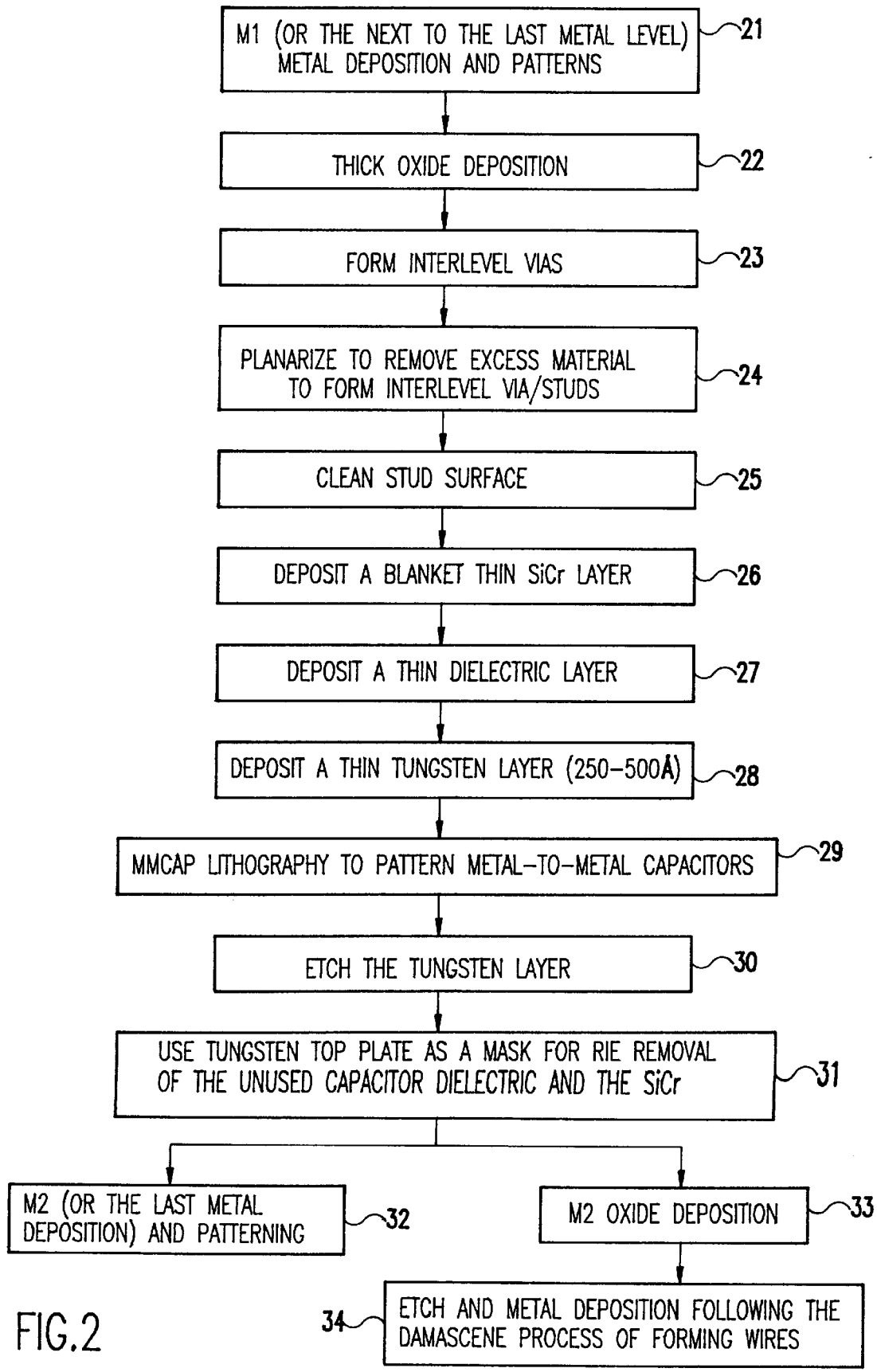
FIG. 2 is a flow diagram showing the process of fabricating on chip metal-to-metal capacitors according to the present invention.
Figure 3:
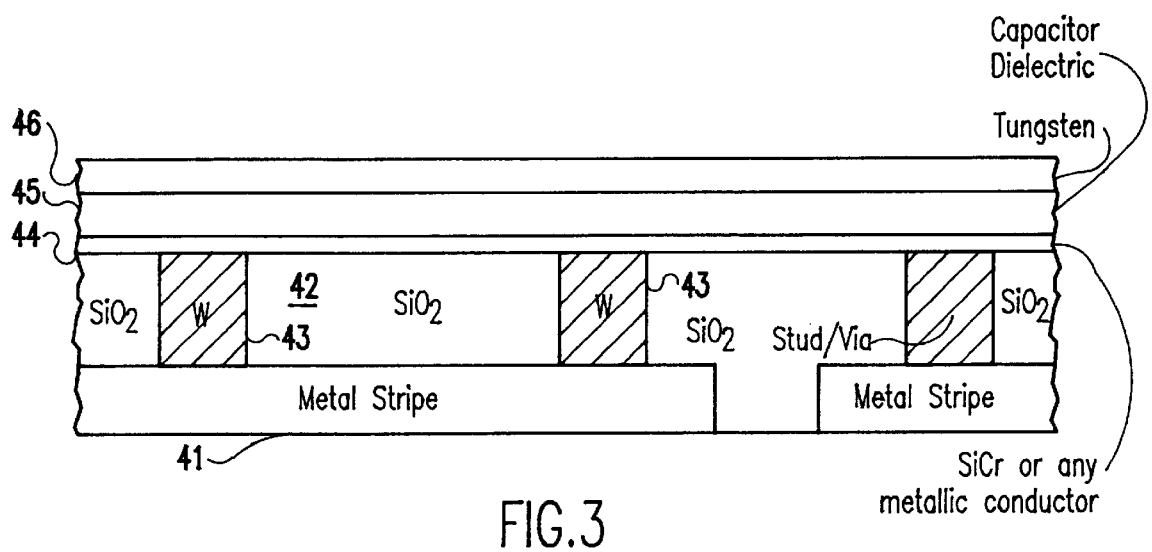
FIG. 3 is a cross-sectional view of the initial stages of the planar process for forming the capacitor according to the invention.

Referring again to the drawings, and more particularly to FIGS. 2 and 3, there is shown in FIG. 2 a flow diagram of the method of producing a metal-to-metal capacitor (MMCAP) for use in integrated circuit applications such as decoupling capacitors. In function block 21, the first metallization layer (M1), or the next to the last metal level, is deposited and patterned. This metal layer is layer 41 in FIG. 3. Thick oxide deposition is done in function block 22 for interlevel insulation. The thick oxide 42, here $SiO_2$, is deposited over the metal layer 41. Next, interlevel vias are formed in function block 23 and then filled using any desired materials (e.g., AlCu, W, Cu, Al, AlCuSi, etc.) to form studs to contact underlying polycrystalline silicon or diffusions formed in the integrated circuit. In FIG. 3, the studs 43 are formed of W. A planarization process is used in function block 24 to remove excess material to form the interlevel studs. The stud surface is cleaned in function block 25 by a touch up process, after which a blanket thin metal layer is deposited in function block 26. The metal layer is preferably SiCr, but may be any metallic conductor such as, for example, Al. This is followed in function block 27 by depositing a thin dielectric layer (e.g., $SiO_2$, $Si_3N_4$, $Al_2O_3$, $Y_2O_3$, etc.). A thin (250–500 Å) refractory metal (e.g. W or Mo) layer is deposited in function block 28. SiCr layer 44, thin dielectric layer 45 and the thin W layer 46 are shown in FIG. 3. The refractory metal layer 46 thickness is contingent on the thickness of the thin dielectric layer 45.

Figure 4:
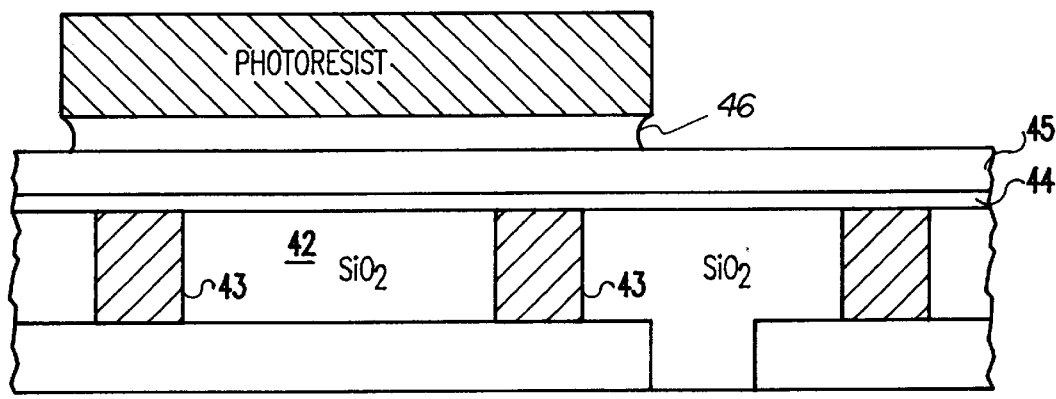
FIG. 4 is a cross-sectional view of the structure shown in FIG. 3 wherein the refractory metal top plate of the capacitor is patterned.

With reference now to FIGS. 2 and 4, MMCAP lithography is used in function block 29 to pattern metal-to-metal capacitors (MMCAP), and this is followed in function block 30 by etching the tungsten layer 46. After the top capacitor is patterned, the tungsten top plate is used in function block 21 as a mask for a following reactive ion etch (RIE) process which removes the unused capacitor dielectric 45 and the SiCr 44 to produce the structure shown in FIG. 5. At this point in the process, the etched wafer can be annealed to improve the dielectric layer 45.

Figure 5:
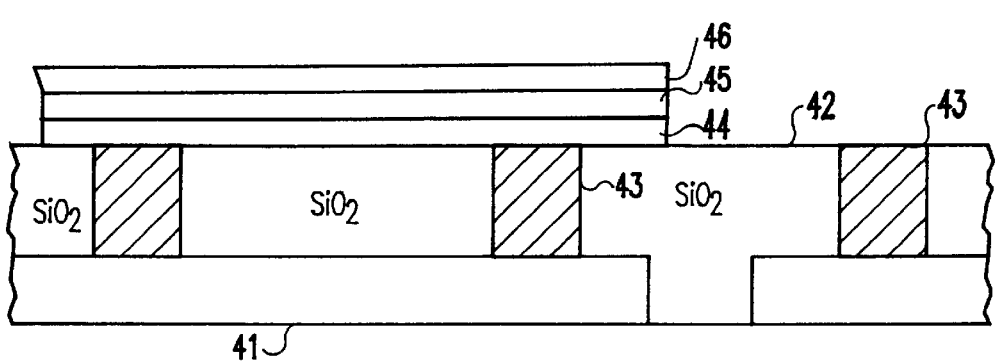
FIG. 5 is a cross-sectional view of the capacitor dielectric and bottom plate of the capacitor patterned using the top plate of the capacitor.
Figure 6A:
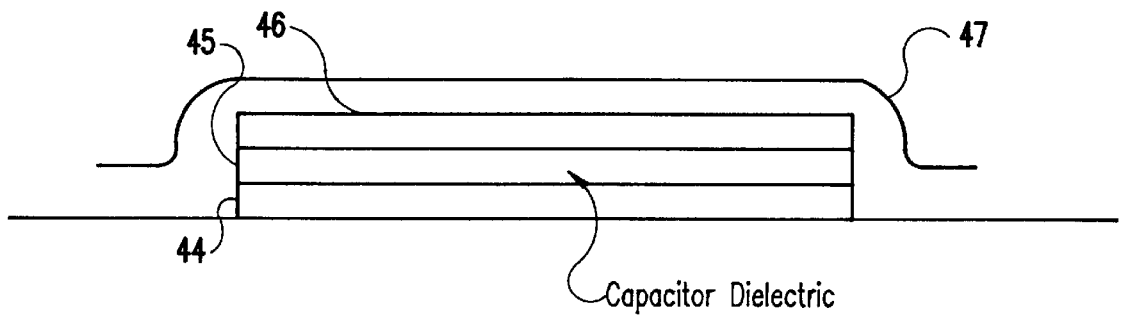
FIGS. 6A and 6B are fragmentary cross-sectional views showing the process of forming dielectric sidewalls that define and protect the edges of the capacitor.
Figure 6B:
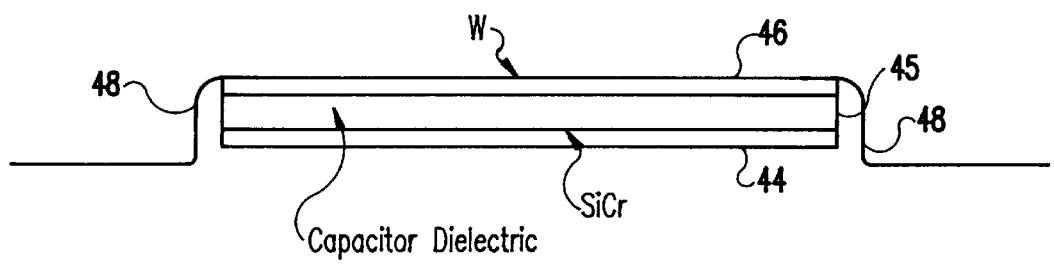
Figure 6C:
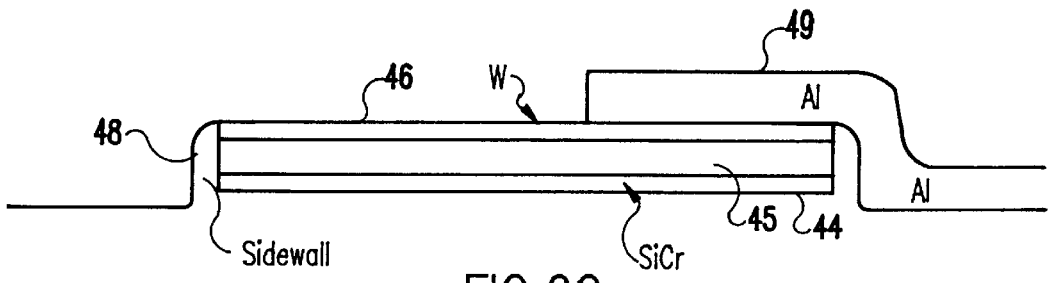
FIG. 6C is a fragmentary cross-sectional view showing a directly deposited and patterned wiring level.

The basic structure of FIG. 5 is further refined as illustrated in FIGS. 6A and 6B. In FIG. 6A, a thin oxide layer 47 is applied. Then an anisotropic RIE is used in FIG. 6B to remove the oxide layer 47 leaving sidewalls 48 which define the limits and protect the sidewalls of the capacitor. If the wiring layer is to be at this level, then, in FIG. 6C, the M2 metallization layer 49 is deposited and patterned. In the example illustrated, Al is the M2 metallization layer, and the patterning is done by a RIE which does not attack the W 46 or the $SiO_2$ sidewalls 48. This is shown in function block 32 of FIG. 2. Alternatively, M2 oxide is deposited, as shown in function block 33, and this is followed in function block 34 by etch and metal deposition following the damascene process of forming wires.

Figure 7:
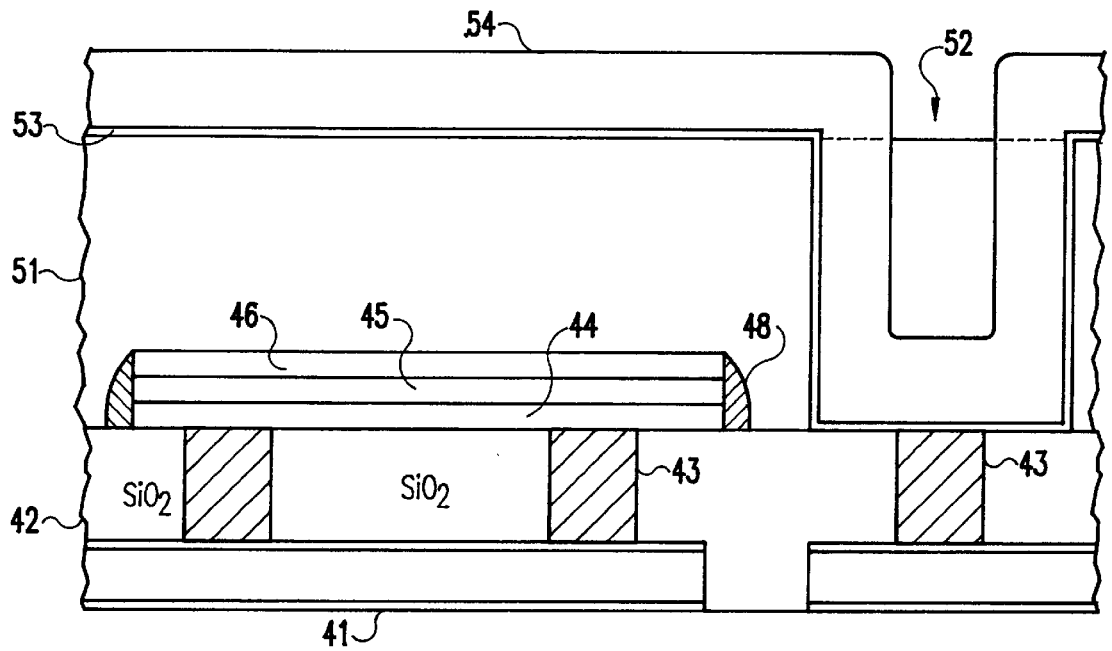
FIGS. 7 to 10 are cross-sectional views showing an alternative process of forming the wiring level by a damascene process.
Figure 8:
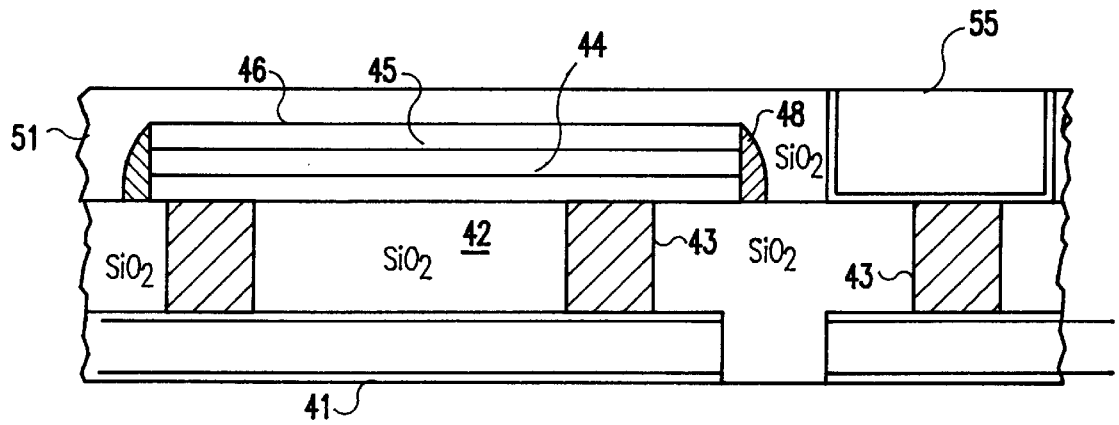
Figure 9:
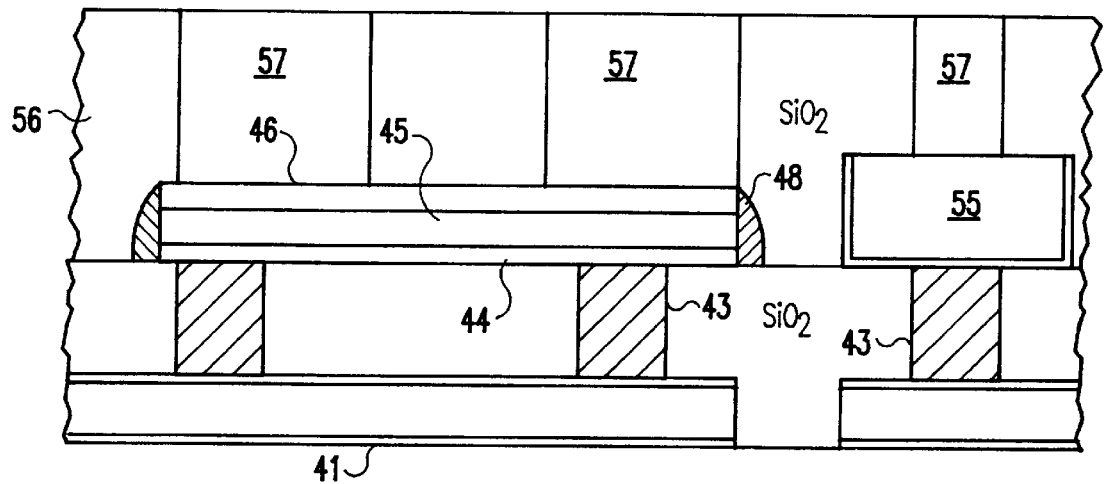
Figure 10:
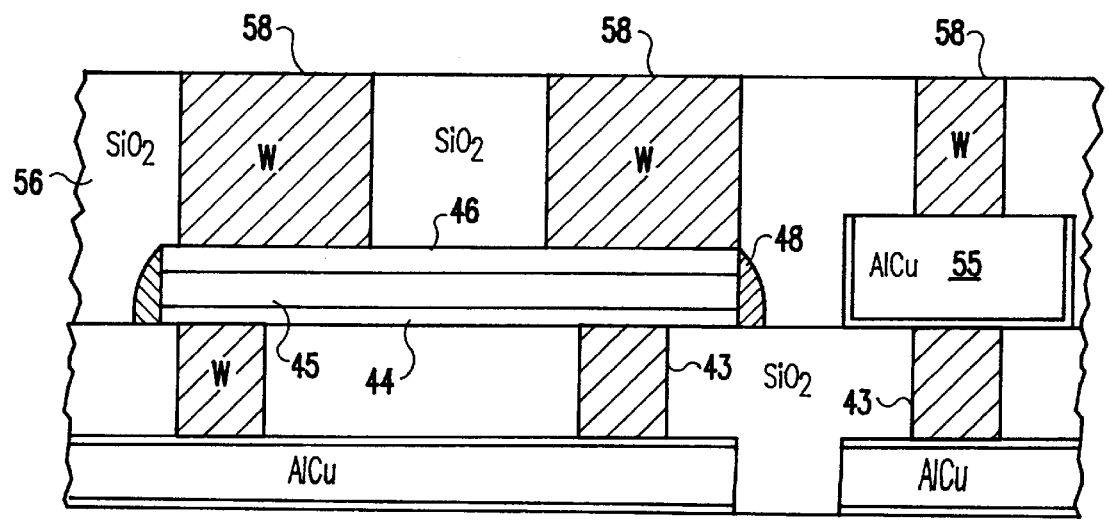

This alternative process is shown in FIGS. 7 to 10. In FIG. 7, an oxide 51 is deposited and then patterned to form regions 52 for the damascene wiring. A thin blanket dielectric layer 53 is then deposited, followed by the M2 metal layer 54. The M2 metal layer 54 may be, for example, Al or Al alloys such as AlCu. This structure is etched and planarized in FIG. 8 to form the damascene wiring 55. Next, in FIG. 9, a thick oxide layer 56 is deposited and wiring pattern trenches 57 are formed which extend to the top plate 46 of the capacitor and the damascene wiring 55. These wiring pattern trenches are filled with contact metal, such as W, to form contact studs 58 as shown in FIG. 10.

Advantages of the invention include the following:
1) The dielectric 45 is deposited on a planar surface. There is no deep trough coverage which may cause yield loss and reliability problems.
2) The capacitor area is determined by the lithography process used to etch the metal and, for large areas, more precision is possible than for arrays of small areas linked together which is required for damascene capacitors.
3) There are no high etch rate selectivity requirements for selecting the dielectric layer 45.
4) Any materials can be used based on the capacitor electrical usage and requirements.
5) Because the thin film of dielectric was deposited after the via/stud process, it also helps to fill into the edge seams around the interlevel studs which make the studs less susceptible to seaming.
6) The reliability can be improved by putting more redundant studs underneath the layer 44 or on top of the layer 46, as particularly shown in FIG. 10.
7) The capacitor edge is defined and protected by a sidewall 48 which enables wiring the device to other circuit elements using only two wiring levels, as shown in FIG. 6A.

The preferred embodiment of the invention is between the last and next to last level of metallization to reduce parasitic capacitance and to permit circuits to exist beneath the capacitor or to place the capacitor prior to deposition of wiring metallurgy to permit the use of higher temperature depositions and anneals to improve the quality and reliability of the capacitor. Moreover, the area can be tailored to the feasible real estate since the MMCAP is less sensitive to the perimeter and more directly sensitive to the area.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for forming an on chip planar metal-to-metal capacitor comprising the steps of:

a) depositing a first metal layer and patterning;
   b) depositing a blanket layer of interlevel dielectric;
   c) planarizing the interlevel dielectric;
   d) forming one or more studs in said interlevel dielectric which contacts said first metal layer and is planarized with the interlevel dielectric surface;
   e) depositing a blanket layer of metallic conductor;
   f) depositing a blanket layer of capacitor dielectric over the metallic conductor;
   g) depositing a blanket layer of refractory metal over the capacitor dielectric;
   h) masking and etching the refractory metal formed in step (g) to form a top plate of the capacitor;
   i) using the patterned refractory metal layer formed in step (h) to pattern the dielectric layer and the metallic conductor layer to form the capacitor dielectric and the bottom plate of the capacitor;
   j) depositing a blanket layer of dielectric, said blanket layer of dielectric being 10 to 2000 Angstroms;
   k) anisotropically etching the dielectric layer formed in step (j) to remove the dielectric from top plate of the capacitor while leaving a protective dielectric sidewall defining edges of the capacitor; and
   l) forming a wiring level contacting the top plate of the capacitor.

2. The method for forming an on chip planar metal-to-metal capacitor recited in claim 1 wherein the metallic conductor is selected from the group comprising SiCr and Al.

3. The method for forming an on chip planar metal-to-metal capacitor recited in claim 2 wherein the metallic conductor is SiCr.

4. The method for forming an on chip planar metal-to-metal capacitor recited in claim 2 wherein the metallic conductor is Al.

5. The method for forming an on chip planar metal-to-metal capacitor recited in claim 1 wherein the capacitor dielectric is selected from the group comprising $SiO_2$, $Si_3N_4$, $Al_2O_3$, and $Y_2O_3$.

6. The method for forming an on chip planar metal-to-metal capacitor recited in claim 5 wherein the capacitor dielectric is $SiO_2$.

7. The method for forming an on chip planar metal-to-metal capacitor recited in claim 5 wherein the capacitor dielectric is $Si_3N_4$.

8. The method for forming an on chip planar metal-to-metal capacitor recited in claim 5 wherein the capacitor dielectric is $Al_2O_3$.

9. The method for forming an on chip planar metal-to-metal capacitor recited in claim 5 wherein the capacitor dielectric is $Y_2O_3$.

10. The method for forming an on chip planar metal-to-metal capacitor recited in claim 1 wherein the refractory metal is selected from the group comprising W and Mo.

11. The method for forming an on chip planar metal-to-metal capacitor recited in claim 10 wherein the refractory metal is W.

12. The method for forming an on chip planar metal-to-metal capacitor recited in claim 10 wherein the refractory metal is Mo.

13. The method for forming an on chip planar metal-to-metal capacitor recited in claim 1 wherein the metallic conductor is SiCr, the capacitor dielectric is $SiO_2$, and the refractory metal is W.

14. The method for forming an on chip planar metal-to-metal capacitor recited in claim 1 wherein the step of forming a wiring level contacting the top plate of the capacitor comprises the steps of:

annealing to improve the capacitor dielectric;

directly depositing a metal wiring layer; and patterning the metal wiring layer using a reactive ion etch that does not attack the top plate of the capacitor or the protective dielectric sidewall.

15. The method for forming an on chip planar metal-to-metal capacitor recited in claim 1 wherein the step of forming a wiring level contacting the top plate of the capacitor comprises the step of using a damascene process for forming the wiring layer.

16. The method for forming an on chip planar metal-to-metal capacitor recited in claim 15 wherein the damascene process comprises the steps of:

depositing a thick layer of dielectric and forming a wiring pattern trenches;

depositing a metal wiring layer; and planarizing to remove the metal wiring layer except in the wiring layer trenches.

17. The method for forming an on chip planar metal-to-metal capacitor recited in claim 16 further comprising the steps of:

depositing a further thick dielectric layer and forming vias extending to the top plate of the capacitor and the damascene wiring; and filling the vias with a contact metal.

* * * * *